United States Patent
Basine

(10) Patent No.: US 9,407,232 B2
(45) Date of Patent: Aug. 2, 2016

(54) SWITCHED BAND-PASS FILTER

(71) Applicant: Robert Bosch GmbH, Stuttgart (DE)

(72) Inventor: Robert Basine, Waverly, NE (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/228,960

(22) Filed: Mar. 28, 2014

(65) Prior Publication Data
US 2014/0292442 A1 Oct. 2, 2014

Related U.S. Application Data
(60) Provisional application No. 61/806,073, filed on Mar. 28, 2013.

(51) Int. Cl.
*H03H 7/01* (2006.01)
*H03H 7/12* (2006.01)

(52) U.S. Cl.
CPC .............. *H03H 7/0161* (2013.01); *H03H 7/12* (2013.01); *H03H 2250/00* (2013.01)

(58) Field of Classification Search
CPC ......... H03H 7/01; H03H 7/12; H03H 7/0161; H03H 7/0153
USPC .................................................. 333/173–175
See application file for complete search history.

(56) References Cited

U.S. PATENT DOCUMENTS

| | | | |
|---|---|---|---|
| 4,153,887 A | 5/1979 | Poppa | |
| 4,453,145 A | 6/1984 | Schuster | |
| 4,571,560 A | 2/1986 | Dobrovolny | |
| 4,615,041 A | 9/1986 | Koskinen | |
| 5,917,387 A * | 6/1999 | Rice et al. | 333/174 |
| 6,009,004 A | 12/1999 | Swamy | |
| 6,483,399 B1 | 11/2002 | Atokawa | |
| 7,265,542 B2 | 9/2007 | Hrubes | |
| 2005/0012565 A1 | 1/2005 | Kamata | |
| 2010/0315102 A1 | 12/2010 | Portmann | |
| 2012/0176205 A1 | 7/2012 | Furuta et al. | |

FOREIGN PATENT DOCUMENTS
GB 675561 7/1952

OTHER PUBLICATIONS
Extended European Patent Office Search Report for Application No. 14162425.4 dated Nov. 4, 2014 (11 pages).

* cited by examiner

*Primary Examiner* — Benny Lee
*Assistant Examiner* — Albens Dieujuste
(74) *Attorney, Agent, or Firm* — Michael Best & Friedrich LLP

(57) ABSTRACT

A switchable band-pass filter is described that includes a first capacitor, a first switch circuit, and a second switching circuit arranged in parallel between a first node and a second node. The first switching circuit includes a third node and a first switch. The first switch is coupled between the third node and the second node. The second switching circuit includes a fourth node and a second switch. The second switch is coupled between the fourth node and the second node. A linking circuit is coupled between the third node. Methods for operating the switchable band-pass filter are also described.

16 Claims, 1 Drawing Sheet

SWITCHED BAND-PASS FILTER

RELATED APPLICATIONS

This application claims the benefit of U.S. Provisional Patent Application No. 61/806,073, filed Mar. 28, 2013, entitled "SWITCHED BAND-PASS FILTER," the entire contents of which are incorporated herein by reference.

BACKGROUND

The present invention relates to a switched band-pass filter for use in systems such as, for example, a wireless intercom.

SUMMARY

In various embodiments, the invention provides a switchable bandpass filter comprising a plurality of parallel resonant circuits. A plurality of switches are selectively opened and closed to cause the circuit to operate in one of four sub-bands.

In one embodiment, the invention provides a switchable band-pass filter including a first capacitor, a first switch circuit, and a second switching circuit arranged in parallel between a first node and a second node. The first switching circuit includes a third node and a first switch. The first switch is coupled between the third node and the second node. The second switching circuit includes a fourth node and a second switch. The second switch is coupled between the fourth node and the second node. A linking circuit is coupled between the third node.

In another embodiment, the invention provides a method of operating a switchable band-pass filter that includes a first switching circuit and a second switching circuit both arranged in parallel with a first capacitor. The first switching circuit and the second switching circuit are both opened to implement a first sub-band frequency filter. The first switching circuit is closed while the second switching circuit is opened to implement a second sub-band frequency filter. The first switching circuit is opened while the second switching circuit is closed to implement a third sub-band frequency filter. The first switching circuit and the second switching circuit are both closed to implement a fourth sub-band frequency filter. A linking circuit between the first switching circuit and the second switching circuit is bypassed when the first and second switching circuits are both in the same state (i.e., both opened or both closed). However, the linking circuit allows the switchable band-pass filter to achieve evenly distributed sub-band frequency filters when one switching circuit is opened and the other switching circuit is closed.

In yet another embodiment, the invention provides a switchable band-pass filter that includes a first capacitor, a first switching circuit, a second switching circuit, and a linking circuit. A first terminal of the first capacitor is coupled to a first node and a second terminal is directly coupled to a second node. The first switching circuit is coupled to the first node and the second node in parallel with the first capacitor. The first switching circuit includes a second capacitor coupled to the first node and a first switch coupled to the second node. The second capacitor is coupled to the first switch at a third node. The second switching is also coupled to the first node and the second node in parallel with the first capacitor. The second switching circuit includes a third capacitor coupled to the first node and a second switch coupled to the second node. The third capacitor is coupled to the second switch at a fourth node. The linking circuit is coupled to the third node and the fourth node and includes an inductor coupled to the third node and a fourth capacitor coupled to the fourth node. The linking circuit is configured such that both terminals of the linking circuit are at the same electric potential when the first switch and the second switch are both opened and also at the same electric potential when the first switch and the second switch are both closed.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
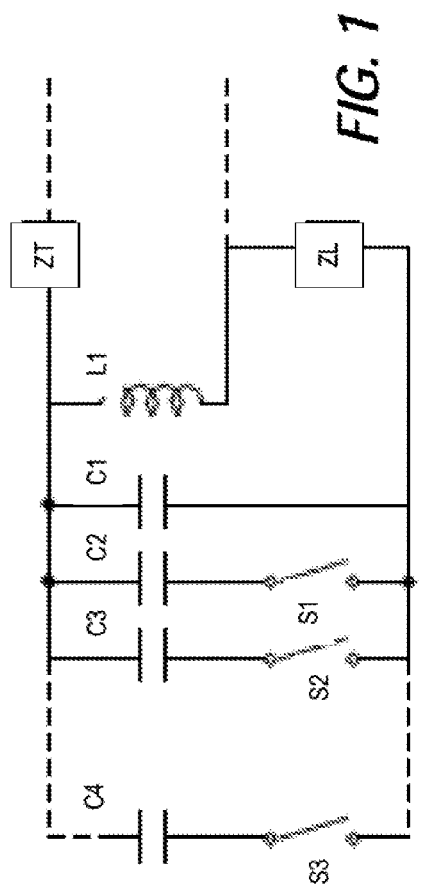
FIG. 1 is an example of a band-pass filter circuit that is switchably operable in four different sub-bands.

A switchable band-pass filter includes a number of parallel resonant circuits. FIG. 1 illustrates one example of a resonant circuit used in a switchable band-pass filter. The circuit of FIG. 1 is coupled to the next resonant circuit by means of impedance ZT if top-side coupling is used and by means of impedance ZL if bottom-side coupling is used (or by both if both means of coupling are used). If top-side coupling is used, ZL is replaced by a short. Conversely, if bottom-side coupling is used, ZT is replaced by a short.

The switchable band-pass filter operates at four filter sub-bands. In this example, the center frequencies of the four filter sub-bands are denoted as F1, F2, F3, and F4 (ordered from lowest frequency to highest frequency). Each sub-band has the same bandwidth B, such that the total switching range of the filter is 4 B. The capacitance of C1 and/or the inductance of L1 are selected (or adjusted) such that a sub-band with center frequency F4 is realized when all switches are open. C2 is selected (or adjusted) such that a sub-band with center frequency F3 is realized when switch S1 is closed and all other switches are opened. C3 is selected (or adjusted) such that a sub-band with center frequency F2 is realized when switch S2 is closed and all other switches are opened.

The fourth sub-band with center frequency F1 can be realized in the circuit of FIG. 1 in one of two ways. First, a fourth capacitor C4 and third switch S3 can be added to the circuit. The capacitance of C4 is selected (or adjusted) such that a sub-band with center frequency F1 is realized when switch S3 is closed and all other switches are opened. Alternatively, S1 and S2 can both be closed simultaneously, eliminating the need for capacitor C4 and switch S3. The first construction can be used to ensure that the fourth sub-band with center frequency F1 is accurately realized, but additional components are necessary. Although the second construction requires fewer components, the center frequency of the sub-band is typically too high. As such, a fourth sub-band with a uniform bandwidth cannot be accurately realized. The magnitude of the error increases proportionately with the relative bandwidth of the filter (the relative bandwidth of each sub-band is B divided by F1, F2, F3, or F4).

Figure 2:
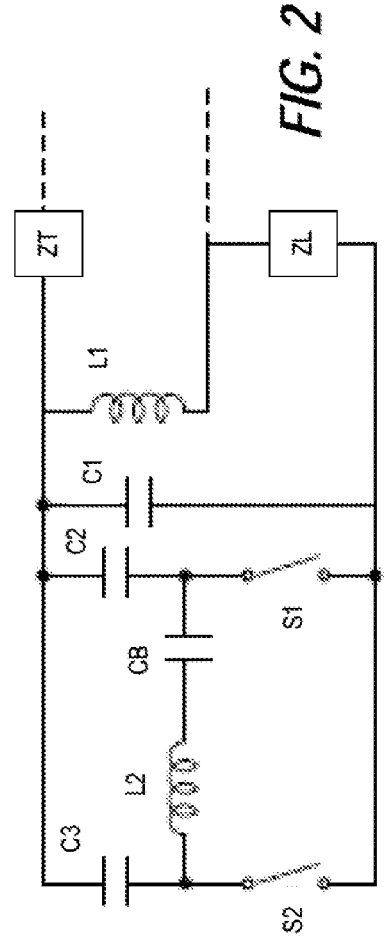
FIG. 2 is another example of a band-pass filter circuit that is swichably operable in four different sub-bands.

FIG. 2 illustrates an alternative resonant circuit for use in a switchable band-pass filter. As illustrated above in FIG. 1, this second example also includes a capacitor C1 and inductor L1 that are selected (or adjusted) such that the first sub-band with center frequency F4 is realized when all switches are open. The example of FIG. 2 also includes switch S1 and capacitor C2 for realizing the second sub-band (with center frequency F3) and switch S2 and capacitor C3 for realizing the third sub-band (with center frequency F4). However, unlike the example of FIG. 1, the example of FIG. 2 also includes an inductor L2 and capacitor CB coupled at nodes between each switch/capacitor combination. Capacitor CB is used for DC blocking.

In the example of FIG. 1, if the capacitance of C2 and C3 are increased proportionately until the fourth sub-band (with center frequency F1) is accurately realized when switches S1 and S2 are closed, the center frequency of the second sub-band and the center frequency of the third sub-band will be too low when only S1 or only S2 are closed, respectively. When inductor L2 is added to the circuit, the frequency range of the first sub-band (with center frequency F4) and the fourth sub-band (with center frequency F1) are not affected because, with both switches either opened or closed, both sides of inductor L2 will be at the same potential. However, if only one switch is closed, the series combination of L2 and either C2 or C3 will be placed in parallel with the resonant circuit. If the value of L2 is high enough, this net impedance is inductive and raises the resonant frequency of the second sub-band (with center frequency F3) and the third sub-band (with center frequency F4). As such, in the example of FIG. 2, capacitor C2, capacitor C3, and inductor L2 can be selected (or adjusted) such that all sub-band frequencies will be correct.

Figure 3:
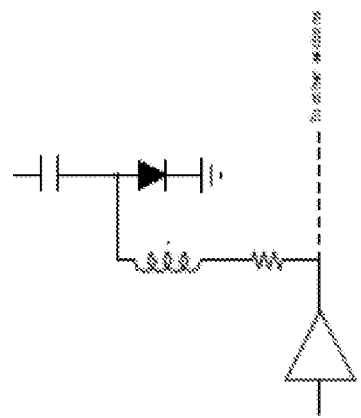
FIG. 3 is a schematic diagram of a PIN diode-based switch of the band-pass filter circuits of FIGS. 1 and 2.

As such, the example of FIG. 2 does not exhibit the trade-off between sub-band frequency accuracy and component cost to the same degree as exhibited in the example of FIG. 1. For example, although the circuit of FIG. 2 includes an additional inductor L2, it does not include a third switch S3. This reduction in required components is further illustrated by examining the components required to implement a switch. FIG. 3 illustrates an example of a PIN diode-based switch that can be incorporated into the circuits of FIG. 1 and FIG. 2. The switch includes a diode, a resistor, and an inductor. Therefore, by eliminating an additional switch, the total number of components for each resonant circuit is reduced by at least a diode and a resistor. Although the circuit of FIG. 2 requires an additional inductor, each switch as illustrated in FIG. 3 also requires an inductor. As such, the addition of the second inductor is more than offset by the removal of the third switch.

Component reduction and system simplification also extend beyond the resonant circuit itself. For each, the driver stage for the entire filter (and the firmware required to actuate it) is simplified because four sub-bands can be accurately realized by operating only two switches in each resonant circuit. Furthermore, since the filter is usually located within a shielded compartment and the driver is usually located outside the shield, there is also one less trace to route. Because each trace, in general, includes a number of bypass capacitors located along its length, elimination of a trace also eliminates the number of required bypass capacitors.

Thus, the invention provides, among other things, a band-pass filter capable of accurately realizing multiple sub-bands each having a uniform bandwidth. Various features and advantages of the invention are further illustrated by the accompanying drawings.

What is claimed is:

1. A switchable band-pass filter comprising:
a first capacitor coupled between a first node and a second node;
a first switching circuit coupled between the first node and the second node in parallel with the first capacitor, the first switching circuit including a third node, a first circuit component coupled between the first node and the third node, and a first switch, the first switch having a first terminal coupled to the third node and a second terminal directly coupled to the second node;
a second switching circuit coupled between the first node and the second node in parallel with the first capacitor, the second switching circuit including a fourth node, a second circuit component coupled between the first node and the fourth node, and a second switch, the second switch having a first terminal coupled to the fourth node and a second terminal directly coupled to the second node; and
a linking circuit directly coupled to the third node and the fourth node, the linking circuit including a third circuit component.

2. The switchable band-pass filter of claim 1, wherein
a first frequency sub-band filter is implemented when the first switch is opened and the second switch is opened,
a second frequency sub-band filter is implemented when the first switch is closed and the second switch is opened,
a third frequency sub-band filter is implemented when the first switch is opened and the second switch is closed, and
a fourth frequency sub-band filter is implemented when the first switch is closed and the second switch is closed, and
wherein a first center frequency of the first frequency sub-band filter, a second center frequency of the second frequency sub-band filter, a third center frequency of the third frequency sub-band filter, and a fourth center frequency of the fourth frequency sub-band filter are equally distributed along an overall bandwidth of the switchable band-pass filter.

3. The switchable band-pass filter of claim 1, wherein the third circuit component includes an inductor configured such that an electric potential on a first end of the inductor is equal to an electric potential on a second end of the inductor when the first switch and the second switch are both closed.

4. The switchable band-pass filter of claim 3, wherein the linking circuit further includes a fourth capacitor in series with the inductor.

5. The switchable band-pass filter of claim 1, wherein, when the first switch is open and the second switch is closed, the second circuit component is in parallel with a series combination of the first circuit component and the linking circuit.

6. The switchable band-pass filter of claim 1, wherein, when the first switch is closed and the second switch is open, the first circuit component is in parallel with a series combination of the second circuit component and the linking circuit.

7. A method of operating a switchable band-pass filter, the switchable band-pass filter including
a first capacitor coupled between a first node and a second node,
a first switching circuit coupled between the first node and the second node in parallel with the first capacitor, the first switching circuit including a third node, a first circuit component coupled between the first node and the third node, and a first switch, the first switch having a first terminal coupled to the third node and a second terminal directly coupled to the second node,
a second switching circuit coupled between the first node and the second node in parallel with the first capacitor, the first switching circuit including a fourth node, a second circuit component coupled between the first node and the fourth node, and a second switch, the second switch having a first terminal coupled to the fourth node and a second terminal directly coupled to the second node, and a linking circuit directly coupled to the third node and the fourth node, the linking circuit including a third circuit component, the method comprising:

opening the first switch and opening the second switch to implement a first sub-band frequency filter;

closing the first switch and opening the second switch to implement a second sub-band frequency filter;

opening the first switch and closing the second switch to implement a third sub-band frequency filter; and closing the first switch and closing the second switch to implement a fourth sub-band frequency filter.

8. The method of claim 7, wherein a first bandwidth of the first sub-band, a second bandwidth of the second sub-band, a third bandwidth of the third sub-band, and a fourth bandwidth of the fourth sub-band are equal and continuously arranged across an overall bandwidth of the switchable band-pass filter.

9. The method of claim 8, wherein a first center frequency of the first frequency sub-band filter, a second center frequency of the second frequency sub-band filter, a third center frequency of the third frequency sub-band filter, and a center frequency of the fourth frequency sub-band filter are equally distributed along the overall bandwidth of the switchable band-pass filter.

10. A switchable band-pass filter comprising:

a first capacitor including a first terminal directly coupled to a first node and a second terminal directly coupled to a second node;

a first switching circuit coupled to the first node and the second node in parallel with the first capacitor, the first switching circuit including a second capacitor coupled to the first node and a first switch coupled to the second node, wherein the second capacitor is coupled to the first switch at a third node;

a second switching circuit coupled to the first node and the second node in parallel with the first capacitor, the second switching circuit including a third capacitor coupled to the first node and a second switch coupled to the second node, wherein the third capacitor is coupled to the second switch at a fourth node; and a linking circuit coupled to the third node and the fourth node, the linking circuit including an inductor coupled to the third node and a fourth capacitor coupled to the fourth node, wherein the linking circuit is configured such that terminals of the linking circuit are at the same electric potential when the first switch and the second switch are both opened and are at the same electric potential when the first switch and the second switch are both closed.

11. The switchable band-pass filter of claim 10, wherein, when the first switch is open and the second switch is closed, the third capacitor is in parallel with a series combination of the second capacitor and the linking circuit.

12. The switchable band-pass filter of claim 10, wherein, when the first switch is closed and the second switch is open, the second capacitor is in parallel with a series combination of the third capacitor and the linking circuit.

13. The switchable band-pass filter of claim 10, wherein a first frequency sub-band filter is implemented when the first switch is opened and the second switch is opened, a second frequency sub-band filter is implemented when the first switch is closed and the second switch is opened, a third frequency sub-band filter is implemented when the first switch is opened and the second switch is closed, and a fourth frequency sub-band filter is implemented when the first switch is closed and the second switch is closed.

14. The switchable band-pass filter of claim 13, wherein a first center frequency of the first frequency sub-band filter, a second center frequency of the second frequency sub-band filter, a third center frequency of the third frequency sub-band filter, and a center frequency of the fourth frequency sub-band filter are equally distributed along an overall bandwidth of the switchable band-pass filter.

15. The switchable band-pass filter of claim 14, wherein a capacitance of the fourth capacitor is selected such that a combined capacitance of the second capacitor in parallel with a series combination of the third capacitor and the fourth capacitor is sufficient to achieve the center frequency of the second frequency sub-band filter, and a combined capacitance of the third capacitor in parallel with a series combination of the second capacitor and the fourth capacitor is sufficient to achieve the center frequency of the third frequency sub-band filter.

16. The switchable band-pass filter of claim 15, wherein a capacitance of the second capacitor and a capacitance of the third capacitor are selected such that a combined capacitance of the second capacitor in parallel with the third capacitor is sufficient to achieve the center frequency of the fourth frequency sub-band filter.

* * * * *